United States Patent Office 3,738,881
Patented June 12, 1973

3,738,881

ANISOTROPIC ETCHING OF SILICON AND GERMANIUM

William Charles Erdman, Danielsville, and Paul Felix Schmidt, Allentown, Pa., assignors to Bell Telephone Laboratories, Incorporated, Murray Hill and Berkeley Heights, N.J.

No Drawing. Filed Sept. 22, 1971, Ser. No. 182,891
Int. Cl. H01l *7/50*
U.S. Cl. 156—17 6 Claims

ABSTRACT OF THE DISCLOSURE

Single crystal silicon and germanium having major faces parallel to the (100) plane may be etched anisotropically with an etchant comprising an oxidizing agent, an alcohol and an alkali metal hydroxide. It has been found in the case of silicon that the presence of the oxidizing agent is not required for etching but inhibits the formation of pyramids which terminate the etching process.

BACKGROUND OF THE INVENTION (1) Field of the invention

This invention relates to a technique for preferentially etching semiconductor material and to an etchant therefor. More particularly, the present invention relates to a technique for anisotropically etching silicon or germanium with an alkaline etchant in the presence of an oxidizing and a passivating agent.

(2) Description of the prior art

Semiconductor devices, whether of the single element or integrated circuit type, are fabricated universally from monocrystalline material in slice form. In both the single element and integrated device fabrication, precise removal of portions of the material is an important aspect of the process. For modern integrated circuit applications, geometry control of the etch pattern has acquired paramount importance. For the air gap insulation process, in particular, it is necessary to separate the individual chips or components of the circuit from each other, and to do this in a manner which sacrifices the least amount of valuable silicon surface in order to arrive at a high density of devices per unit area.

It has been known for some time that the (111) plane of silicon etches more slowly than the (100) or (110) planes in alkaline aqueous solution, and further, that the etch rate of the (110) plane (or more properly speaking, of two adjacent (211) planes, which crystallographically are very close to the (110) plane can be depressed by the addition of aliphatic alcohols, of which isopropyl or n-butyl alcohol are typical examples. Thus, when a (100) oriented silicon slice is etched in hot alkaline solution in the presence of an aliphatic alcohol, precise control over the geometry of the pattern to be etched is obtained.

Until now this process on (100) oriented silicon was severely hindered by a premature termination of the etching action due to the formation of innumerable (111) sided pyramids on the (100) surface undergoing etching, the etch rate of the (111) faces being extremely low.

Heretofore, reports have not appeared in the literature relative to the anistropic etching of germanium. At the present time, silicon is generally preferred by industry because of the higher operating temperatures of devices made from silicon compared to those from germanium. However, carrier mobilities in germanium are considerably higher than in silicon, and for high frequency devices, germanium substrates will always be of interest.

The present invention demonstrates that addition of an oxidizing agent of a suitable redox potential eliminates the formation of (111) sided pyramids on the (100) surface of silicon during etching in alkaline aqueous solution, and that this same solution also etches germanium in precisely the same anisotropic manner as it etches silicon. In the absence of the oxidizing agent, no etching of germanium would occur, since germanium is more noble than hydrogen in the electromotive series of the elements, and is therefore not attacked by hot alkaline aqueous solutions.

SUMMARY OF THE INVENTION

In accordance with the present invention, the prior art limitations for precise geometry control in the etching of (100) oriented silicon have been successfully obviated by utilizing a novel etchant comprised of an alkaline aqueous solution, an oxidizing agent, and a passivating alcohol. The same etchant has also been found to etch germanium at a commercially practical rate, and with the same high degree of geometry control as achieved on silicon.

DETAILED DESCRIPTION

The novel etchant described herein comprises (a) a strongly alkaline aqueous solution for rapid attack upon the (100) face of silicon (and of germanium if an oxidizing agent is simultaneously present), (b) a passivating alcohol which depresses the undesirably rapid etch rate of the (110) planes, that is, two adjacent (211) faces as noted above, of silicon (or germanium in the presence of an oxidizing agent), and (c) an oxidizing agent which suppresses the formation of (111) sides pyramids on the (100) surface of silicon, and enables the etching of germanium to proceed.

The strongly alkaline aqueous solutions alluded to hereinabove are typically selected from among the hydroxides of potassium and sodium. These materials have been found to be efficacious from a process standpoint and to be economically practical. However, the practice of the present invention is not limited thereto and other strongly alkaline agents such as the hydroxides of rubidium and cesium as well as quaternary ammonium hydroxides may be employed with equal efficacy.

With respect to the selection of passivating and oxidizing agents, the interrelationship therebetween must first be considered. Thus, it is known that alcohols can be readily oxidized to aldehydes or ketones; however, the ease with which any specific alcohol will be oxidized is dependent upon its chemical structure, aromatic alcohols being more stable than aliphatic alcohols and long chain aliphatic alcohols being more stable than short chain aliphatic alcohols. It has been determined with respect to silicon that the redox potential must be sufficiently high to prevent the formation of (111) sided pyramids on the (100) surface but not so high as to cause the passivating alcohol to oxidize rapidly. The same considerations apply with respect to germanium with the additional requirement that the redox potential of the oxidizing agent be high enough to enable rapid attack of the (100) surface of germanium in hot alkaline solution. Since the formation of the (111) sided pyramids on the (100) surface of silicon appears to be attributed to the action of hydrogen (which results from the dissolution reaction of silicon with water) and since germanium is only slightly more noble than hydrogen, these requirements are satisfied by selecting an oxidizing agent which is strong enough to oxidize hydrogen but not strong enough to oxidize the alcohol selected at an unduly rapid rate. In light of the fact that the oxidation resistance of the various alcohols varies over a considerable range, the type and concentration of oxidizing agent selected can also vary over a wide range.

Turning now to a consideration of specific combinations of passivating alcohol and oxidizing agent it has been found that the chromate ion in combination with aliphatic alcohols, and hydrogen peroxide in combination with tetrahydrofurfuryl alcohol are satisfactory. With respect to silicon, it has been determined that aliphatic alcohols are more suitable as passivating agents for the (110) plane than aromatic alcohols and that the chromate ion fulfills the role of preventing pyramid formation without attacking the aliphatic alcohol at an appreciable rate. Hydrogen peroxide, a stronger oxidizing medium than chromate ion is suitable in combination with tetrahydrofurfuryl alcohol and unsatisfactory with the aliphatic alcohols because of the rapid rate of attack thereon. The same considerations obtain with respect to germanium.

The term aliphatic alcohols as employed herein includes those unsubstituted alcohols having from 3 to 7 carbon atoms in the chain. Typical materials following within the scope of this definition are n-propyl, isopropyl, n-butyl, secondary butyl, tertiary butyl, pentyl, hexyl alcohols and the like. The limitations in the number of carbon atoms in the chain are dictated by practical considerations relative to solubility at the upper limit and marginal anisotropic etching at the lower limit.

In addition to hydrogen peroxide, oxidizing agents may be selected from among potassium and sodium chromate.

In the practice of the present invention, the oxidizing agent is employed in an amount ranging from 1–10 millimols per liter of etchant, such range being dictated by the observed reduction in pyramid density. The alcohols are employed in a concentration sufficient to reduce the etch rate of the (110) plane. The etching procedure as described herein is conveniently conducted at a temperature within the range of 70–90° C.

Examples of the application of the present invention are set forth below. They are intended merely as illustrations and it is to be appreciated that the methods described may be varied by one skilled in the art without departing from the spirit and scope of the invention.

EXAMPLE 1

Anisotropic etching of 4 ohm-centimeter, n-type germanium bearing a micropattern of sputtered photoresisted zirconium as an etching mask, was effected at 85° C. in an etchant comprising 4.5 normal potassium hydroxide, 0.2 normal tetrahydrofurfuryl alcohol and 20 milliliters of 30% hydrogen peroxide per liter of etchant. Etching was effected to a depth of 13 microns after 20 minutes, preferentially on the (100) surface of the germanium.

EXAMPLE 2

The procedure of Example 1 was repeated utilizing 10 ohm-centimeter, n-type silicon. Etching was effected to a depth of 20 microns after 20 minutes, preferentially on the (100) surface thereof. It is noted that the formation of the (111) sided pyramids, which normally tend to passivate the (100) surface prematurely, were eliminated.

For comparative purposes, the procedure of this example was repeated in the absence of hydrogen peroxide, the oxidizing agent, it was observed that the formation of the deleterious pyramid caused passivation of the (100) surface and termination of etching process.

EXAMPLE 3

The procedure of Example 2 was repeated with the exception that 10 millimols per liter of etchant of potassium chromate were substituted for the hydrogen peroxide. Etching was effected to a depth of 25 microns after 20 minutes, preferentially on the (100) surface of the silicon.

EXAMPLE 4

The procedure of Example 3 was repeated wherein the tetrahydrofurfuryl alcohol was replaced first by n-propyl alcohol and subsequently by isopropyl, n-butyl, secondary butyl and tertiary butyl alcohol. Etching in each case was effected to a depth of approximately 25 microns over a 20-minute period, preferentially on the (10) surface. Again, it was noted that the formation of the deleterious pyramid was obviated by means of the described etchant.

What is claimed is:

1. Technique for anistropic chemical etching of a monocrystalline semiconductor body selected from the group consisting of (100) oriented silicon and germanium, which comprises applying to said semiconductor body carrying a suitable micropattern formed by an etch-resistant mask an etchant maintained at a temperature within the range of 70° to 90° C., said etchant comprising a solution of a hydroxide selected from the group consisting of potassium, sodium, cesium, quaternary ammonium and rubidium hydroxides, an oxidizing agent selected from the group consisting of hydrogen peroxide and potassium chromate and an alcohol selected from the group consisting of aliphatic unsubstituted alcohols having from 3 to 7 carbon atoms and tetrahydrofurfuryl alcohol, hydrogen peroxide being employed only in conjunction with tetrahydrofurfuryl alcohol, said oxidizing agent being employed in an amount ranging from one to ten millimols per liter of etchant.

2. Technique in accordance with claim 1 wherein said hydroxide is potassium hydroxide and said oxidizing agent is hydrogen peroxide.

3. Technique in accordance with claim 1 wherein said hydroxide is potassium hydroxide and said oxidizing agent is potassium chromate.

4. Technique in accordance with claim 1 wherein said hydroxide is sodium hydroxide and said oxidizing agent is potassium chromate.

5. Technique in accordance with claim 2 wherein said alcohol is tetrahydrofurfuryl alcohol.

6. Technique in accordance with claim 3 wherein said alcohol is n-propyl alcohol.

References Cited

UNITED STATES PATENTS

| | | | |
|---|---|---|---|
| 3,171,762 | 3/1965 | Rutz | 148—175 |
| 3,436,286 | 4/1969 | Lange | 156—17 |

JACOB H. STEINBERG, Primary Examiner

U.S. Cl. X.R.

252—79.4, 79.5